United States Patent [19]

Dautartas et al.

[11] Patent Number: 4,861,126
[45] Date of Patent: Aug. 29, 1989

[54] LOW TEMPERATURE INTRINSIC GETTERING TECHNIQUE

[75] Inventors: Mindaugas F. Dautartas, Macungie; Alain S. Harrus, Philadelphia; Edward P. Martin, Jr., Bethlehem; Fred A. Stevie, Upper Macungie Township, Lehigh County, all of Pa.

[73] Assignee: American Telephone and Telegraph Company, AT&T Bell Laboratories, Murray Hill, N.J.

[21] Appl. No.: 190,721

[22] Filed: May 5, 1988

Related U.S. Application Data

[62] Division of Ser. No. 115,286, Nov. 2, 1987.

[51] Int. Cl.⁴ .................................................. G02B 6/12
[52] U.S. Cl. ................................ 350/96.11; 350/96.13
[58] Field of Search ............... 350/96.11, 96.12, 96.13, 350/96.14

[56] References Cited

U.S. PATENT DOCUMENTS

| | | | |
|---|---|---|---|
| 3,632,438 | 1/1972 | Richardson et al. | 437/236 |
| 3,963,468 | 6/1976 | Jaeger et al. | 350/96.3 X |
| 4,284,663 | 8/1981 | Curruthers et al. | 427/164 |
| 4,525,239 | 6/1985 | Wang | 156/645 |
| 4,597,985 | 7/1986 | Chandross et al. | 427/39 |

*Primary Examiner*—Frank Gonzalez
*Attorney, Agent, or Firm*—Wendy W. Koba

[57] ABSTRACT

Ionic drift in integrated optical devices is reduced by the utilization of a gettering layer interposed between the surface dielectric and the electrodes. The material used to form this layer is capable of gettering the mobile ions at a relatively low temperature (for example <600° C.).

6 Claims, 5 Drawing Sheets

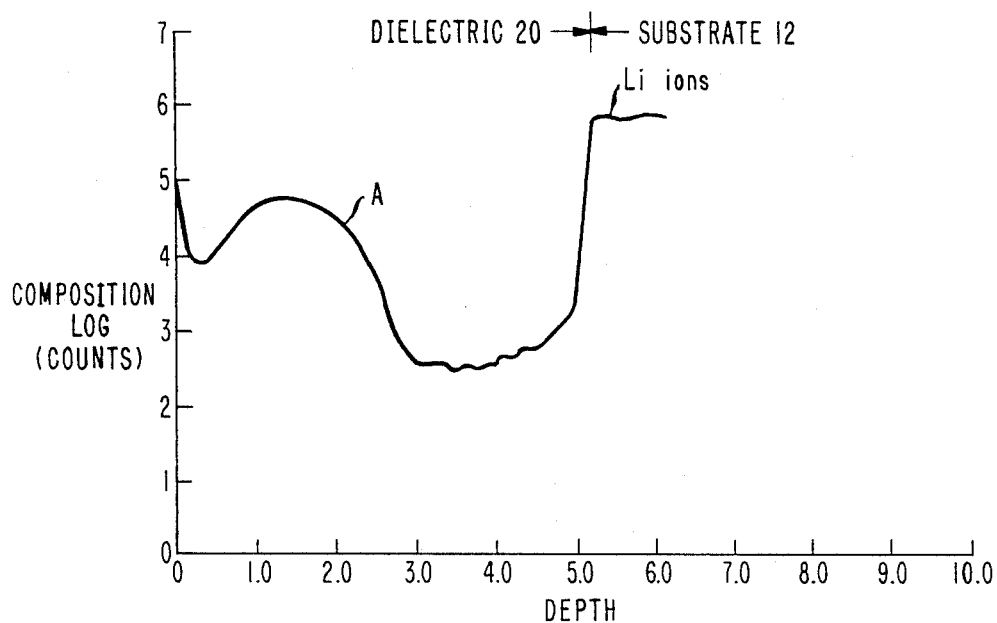
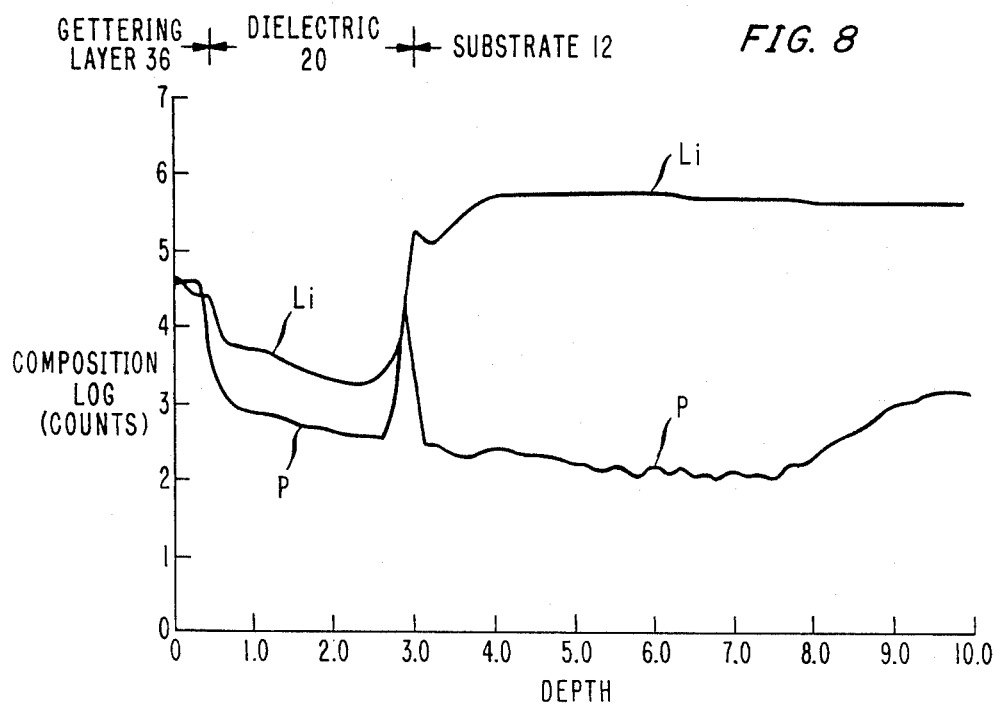

LOW TEMPERATURE INTRINSIC GETTERING TECHNIQUE

This is a division of application Ser. No. 115,286 filed Nov. 2, 1987 (still pending).

BACKGROUND OF THE INVENTION

This invention relates to a technique for achieving low temperature (for example, <600° C.) gettering of contaminants in integrated device structures, these structures including but not limited to, silicon-based multi-level metal layer devices, high-speed III-V devices, and integrated optic devices.

As the complexity of various integrated structures increases, it has become difficult, if not impossible, to utilize the conventional high temperature gettering techniques well-known in the art, one exemplary technique being disclosed in U.S. Pat. No. 3,632,438 issued to H. G. C. Richardson et al on Jan. 4, 1972.

In the realm of silicon integrated circuit technology, for example, multi-level metallization schemes are becoming more prevalent. This places an upper limit on the processing temperatures used after the formation of the first metal layer. Due to the problems of Hillock formation and contact resistance, the highest processing temperature subsequent to the formation of this first metallization cannot exceed 400° C. The dielectric isolation between this first metal layer and subsequent metal layers if deposited at temperatures consistent with this upper limit. However, there is not conventional technique for gettering impurities present in this layer at or below this temperature limit of 400° C.

Galium arsenide (GaAs) wafers grown by liquid phase epitaxy (LPE) processes exhibit poor intrinsic properties such as uniformity, purity and electron mobility. These wafers cannot withstand the high temperatures associated with conventional silicon gettering. Therefore, extrinsic gettering techniques (external mechanical damaging techniques) have been utilized to improve the device properties. One such exemplary prior art extrinsic gettering method for GaAs is disclosed in U.S. Pat. No. 4,525,239 issued to F-C Wang on June 25, 1985. Although the disclosed method is capable of gettering the impurities, an intrinsic method of accomplishing the same result would be preferable, since the process of mechanically damaging wafers must be well-controlled and is inherently timeconsuming.

In the rapidly maturing field of optical communications, integrated optical devices such as switches, beam splitters, couplers, etc., are finding increasing importance. These devices usually comprise a number of common components-an optically anisotropic crystal substrate (lithium niobate or lithium tantalate being common choices), waveguiding structures diffused into the surface of the substrate (titanium or tantalum metals, for example) and electrodes disposed over the surface of the substrate above the waveguides. A dielectric layer is used to insulate the substrate from the electrodes.

FIG. 1, which illustrates in cross-section a conventional prior art optical switch 10, is representative of the type of device structure described above. Switch 10 comprises an LiNbO$_3$ substrate 12 and a pair of titanium (Ti) waveguides 14,16 diffused into top major surface 18 of substrate 12. A dielectric layer 20 is disposed to cover top major surface 18, where layer 20 may comprise SiO$_2$. A pair of electrodes, 22,24 formed of aluminum, for example, are deposited to cover waveguides 14,16. In operation of switch 10, an optical signal I passing through the waveguides travels in the direction indicated in FIG. 1. It is well known that this optical signal may be "switched" from one waveguide to another by the application of an external voltage, since the voltage will result in the formation of an electric field in the waveguides and substrate, this electric field thus modifying the respective refractive indices of these regions. For example, an applied voltage 26 of given magnitude V will cause optical signal I traveling through waveguide 14 to "switch" to waveguide 16.

A problem with these prior art integrated optic devices is that they are subject to ionic drift which is capable of degrading the device performance. Ionic drift is a time-dependent phenomenon which results in the creation of an electric field $E_{ionic}$ which opposes the electric field $E_{applied}$ induced by the applied voltage. This is illustrated by the build-up of positive charge 28 under electrode 24 in FIG. 1. In conventional LiNbO$_3$ or LiTaO$_3$ devices, these positive charges are mobile Li ions from substrate 12 which travel along the electric filed lines as shown. In general, these ions may be classified as alkali ions and include, among others, lithium, sodium, and potassium. To maintain the same state in switch 10 in the presence of $E_{ionic}$, therefore, an ever-increasing voltage is required to be applied between electrodes 22 and 24. Without some means of removing ionic charges 28, therefore, device performance limitations will be exceeded and the switch will fail.

In summary, therefore, a great need exists in the prior art for an intrinsic gettering technique which is functional at the relatively low temperature processing limits of many state-of-the-art devices.

SUMMARY OF THE INVENTION

The need remaining in the prior art is addressed by this invention which relates to a technique for reducing ionic drift in integrated devices by using a gettering layer between the device dielectric and electrode structure.

In accordance with the teachings of the present invention, the conventional process of forming integrated devices is altered to include the formation of a gettering layer, for example, phosphosilicate glass, before the final electrode structure is formed. The gettering layer is annealed at a temperature sufficient to trap the mobile ions without causing appreciable out-diffusion of other materials.

For use with silicon and III-V device structures, the gettering layer is formed as a relatively thin intermediate layer between first and second thick dielectric layers, the combination of these dielectric layers forming the insulation between the device and surface electrodes. The mobile ions remain trapped in this intermediate region, far removed from either active device areas or surface electrodes. The gettering material must be located at a distance removed from the electrodes, since multi-level metal structures use an undensified silicon dioxide dielectric, which if placed in contact with teh gettering material would lead to corrosion of the electrodes.

With respect to integrated optical devices, a simplified variation of this structure may be employed. In particular, the gettering layer is merely formed on top of the device dielectric and the electrodes deposited directly over the gettering layer at the desired locations. The electrodes are then used as a mask to remove all of the exposed gettering material, since the high conductivity of this layer would result in creating a short circuit between adjacent electrodes.

BRIEF DESCRIPTION OF THE DRAWING

Referring now to the drawings, where like numerals represent like parts in several views:

FIG. 7 illustrates a secondary iron mass spectroscopy analysis of a conventional integrated optic device, such as the switch of FIG. 1, illustrating in particular the presence of lithium ions within the dielectric;

FIG. 8 illustrates a secondary iron mass spectroscopy analysis of an integrated optical device formed in accordance with the present invention, illustrating the movement of the Li ions to the layer of gettering material;

DETAILED DESCRIPTION

Figure 2:
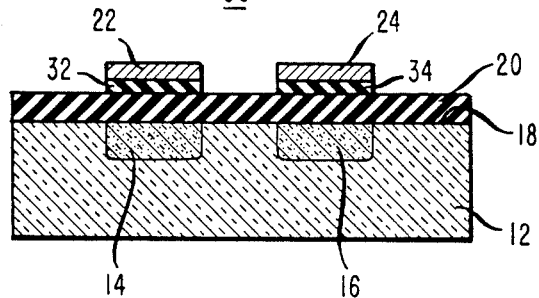
FIG. 2 illustrates an improved optical switch including a gettering layer formed in accordance with the present invention.

An integrated optic switch 30, formed using the techniques of the present invention is illustrated in FIG. 2. As with prior art switch 10, switch 30 of FIG. 2 comprises an anisotropic optical crystal substrate 12, a pair of waveguides 14, 16, a dielectric layer 20, and a pair of electrodes 22 and 24. In accordance with the present invention, however, switch 30 further comprises a layer of gettering material, in particular, phosphosilicate glass, interposed between dielectric 20 and electrodes 22,24. As stated above, this layer contains the immobilized alkali ions, for example, Li ions, which travel from one electrode to the other in the presence of an applied voltage. In the final device structure, this gettering layer takes the form of strips 32,34 located underneath electrodes 22 and 24, respectively. As stated above and discussed in greater detail hereinafter, the remainder of this gettering material must be removed (etched) to prevent the formation of a shunt between electrodes 22 and 24.

Figure 3:
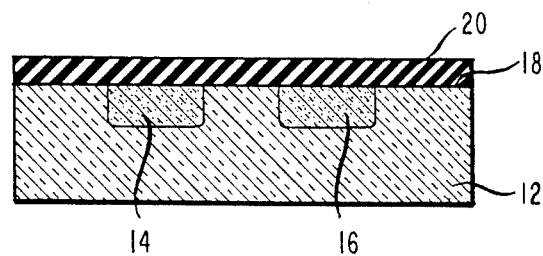
FIGS. 3-6 illustrate various steps in the fabrication of the switch arrangement of FIG. 2.

The process of fabricating switch 30 will now be described in greater detail. Referring to FIG. 3, switch 30 is illustrated at an early step in the fabrication process, where waveguides 14 and 16 have been formed in substrate 12, and dielectric layer 20 has been deposited to cover top major surface 18 of substrate 12. Waveguides 14 and 16 are usually formed in substrate 12 by the diffusion of an appropriate material, for example, titanium or tantalum, through top major surface 18 of substrate 12. U.S. Pat. No. 4,284,663 issued to J. R. Carruthers et al on Aug. 18, 1981, describes in detail this indiffusion process. Dielectric layer 20 is conventionally formed by depositing a silicon dioxide layer of an appropriate thickness, for example, in the range of 1500-3000 Å. In accordance with the properties of the material forming the optical substrate, this deposition should be carried out at a relatively low temperature, for example, less than 600° C. This is due to the fact, mentioned above, that $Li_2O$ has a tendency to diffuse out of the substrate at elevated temperatures and disadvantageously affect the final device performance. Silicon dioxide as derived from diacetoxyditertiarybutooxysilane (DADBS) has been found to be the preferable material for forming this dielectric layer. A complete description of the process of depositing this material may be found in U.S. Pat. No. 4,597,985 issued to E. A. Chandross et al on July 1, 1986.

Figure 4:
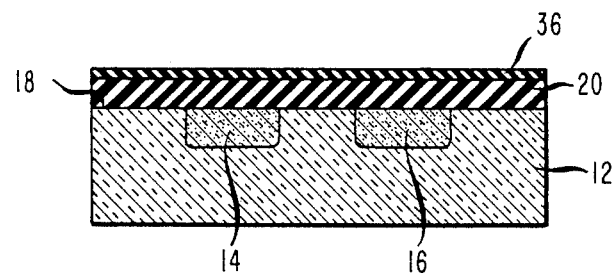

Subsequent to the formation of dielectric layer 20, a layer of gettering material 36 is formed to substantially cover dielectric 20, as illustrated in FIG. 4. As stated above, phosphosilicate glass (p-glass) may be used as this layer, since it may be deposited using a "spin-in" process, or other low temperature deposition processes. In accordance with the present invention, layer 36 is not required to comprise an appreciable thickness. For example, a layer of only 300 Å has been found to be sufficient to getter the majority of the mobile Li ions in the dielectric layer. In fact, a gettering layer 36 having a thickness in the range of 2%-10% of the thickness of deposited dielectric layer 20 has been found sufficient for present purposes. After the formation of p-glass layer 36, the device is annealed at a temperature sufficient to move the Li ions into layer 36. This is, of course, the critical step in the fabrication process of the present invention. The annealing must be performed at a temperature which activates the movement of the mobile ions from dielectric layer 20 into the gettering layer without causing appreciable outdiffusion of other materials, for example, $Li_2O$. A temperature of approximately 500° C. has been found to be sufficient for this purpose.

Figure 5:
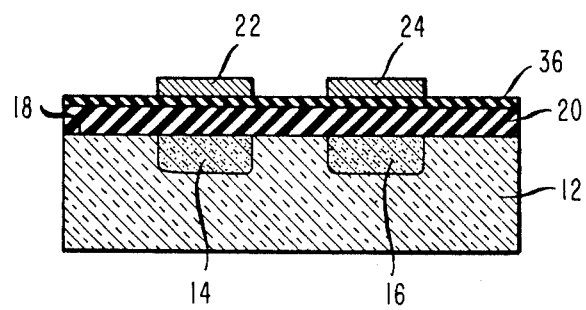
Figure 6:
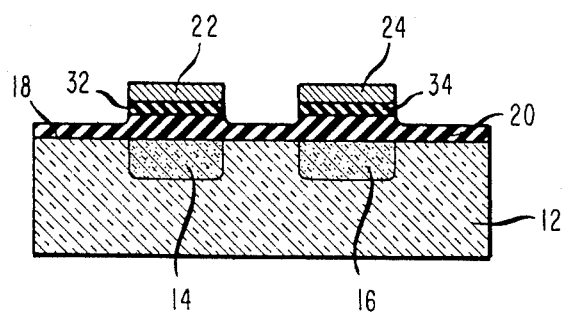

The next step in the fabrication process, involving the formation of the device electrodes, is essentially identical to that of the prior art. In particular, a metal layer (usually Al) is deposited to cover the dielectric, in this case the annealed gettering layer 36, and patterned to form the desired electrode structure. In this example, the metal layer is patterned to form electrodes 22 and 24, as shown in FIG. 5. FIG. 6 illustrates the final device structure, where layer 36 has been etched to remove any exposed material. As stated above, this step is essential since the gettering layer is sufficiently conductive and polarized so as to create a shunt between electrodes 22 and 24. In theory, therefore, only that portion of layer 36 sufficient to "break" this shunt path need be removed. In actual practice, however, it is far easier to remove all exposed material, since electrodes 22 and 24 may be used as an etch mask and the material removed by treating the surface of the device with a buffered HF solution. This etching must continue for a period of time sufficient to remove the complete thickness of layer 36, since even a layer of only a few Å may be sufficiently conductive to create a shunt. In fact, it is preferred that the etching process be continued to remove a small amount of the underlying dielectric 20 which will also etch in a buffered HF solution, to insure that all of the gettered material has been removed. In fact, all of the underlying dielectric 20 may be removed without affecting device performance. Obviously, other methods of removing layer 36 may also be used in accordance with the present invention, so long as gettered layer 36 is completely removed and the shunt path between electrodes 22 and 24 is broken.

Figure 1:
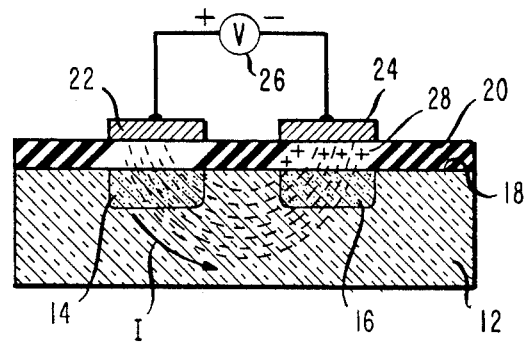
FIG. 1 illustrates a conventional integrated optical switch arrangement of the prior art.

The modification of the composition of an integrated optical device formed using the gettering technique of the present invention is clearly illustrated by comparing FIGS. 7 and 8. FIG. 7 is a representation of the composition profile of a conventional prior art integrated optical device, such as switch 10 of FIG. 1. FIG. 8 is a representation of the composition profile of a device which has been gettered in accordance with the teachings of the invention, such as switch 30 of FIG. 2. Referring to both FIGS. 7 and 8, the abscissa is defined as the depth of the associated device as measured along a vertical cut, the origin being defined as the top surface of the device. For FIG. 8, the origin is defined as the top surface of dielectric 20. With respect to FIG. 8, the origin is the top surface of gettering layer 36. The ordinate is scaled logarithmically to indicate the relative amounts of various materials appearing at any particular depth within the device. As seen by reference to FIG. 7, a large concentration of Li ions, indicated by the letter "A" in FIG. 7, exists in dielectric layer 20, near the surface. It is the presence of these ions, as discussed above, that results in degrading device performance through ionic drift.

FIG. 8, in comparison, illustrates the composition profile of a device including gettering ayer 36, after this layer has been annealed. As shown, the Li ions present in the dielectric region defined by layers 20 and 36 reside mainly in gettering layer 36. Since this layer is removed to form the final device structure, the majority of Li ions will also be removed. Furthermore, any remaining Li ions will be immobilized in gettering layer 36. Interestingly, the profile of the Li ions through dielectric 20 follows the phosphorous dopant profile introduced by gettering layer 36. It is to be noted that these particular composition profiles are shown as exemplary only, and are related to a set of particular processing parameters including, but not limited to, gettering layer thickness, phosphorous dopant concentration, anneal temperature and time interval, etc. Further, it is to be understood that the gettering technique of the present invention is applicable to any device structure which is subject to ionic drift and cannot be gettered using the conventional high temperature gettering techniques prevalent in the silicon technology. The majority of such devices are, in fact, optical devices formed on a substrate of an anisotropic optical crystal.

Figure 9:
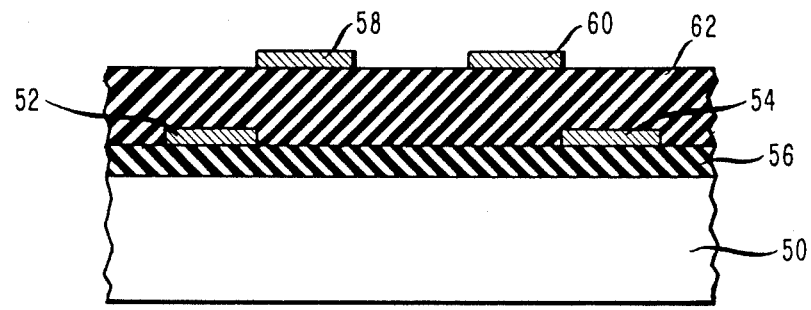
FIG. 9 illustrates a simplified view of an exemplary prior art multilevel metal silicon integrated circuit structure.

As described above, the low temperature gettering technique of the present invention is especially useful in silicon devices which incorporate two or more levels of metallic contacts. An exemplary multi-level metal structure as is known in the prior art is illustrated in FIG. 9. A silicon body 50 is shown for the sake of simplicity as only a substrate, however, it is this layer which contains the active device regions. Metal contacts 52,54 to selected areas are insulated from the substrate by dielectric 56. In the prior art single level metal arrangements, these layers would form the final device structure, and a high temperature getter would be used extensively to remove defects from substrate 50. As circuit complexity increases, however, it is desirable to be able to achieve a larger number of metal contacts without utilizing a larger surface area. Therefore, a second set of metal contacts 58,60 is disposed in the vertical direction above metal contacts 52,54 and is separated from these metal contacts by an insulating layer 62. In accordance with the multi-level metal technology, insulating layer 62 must be deposited at a relatively low temperature (<400° C.) so as not to create the problems (Hillock formation, etc.) described above. It has been discovered, however, that dielectric layer 62 becomes uncontrollably contaminated with sodium, for example, during subsequent etchback and planarization operations required to prepare the device for deposit of metal contacts 58,60. These contaminants thus introduce mobile ions into the structure, subjecting the final device to the same ionic drift problem discussed above in association with the $LiNbO_3$ devices. A conventional high temperature getter would result in trapping these defects, but at the cost of destroying the metal contacts, clearly an undesirable result.

Figure 10:
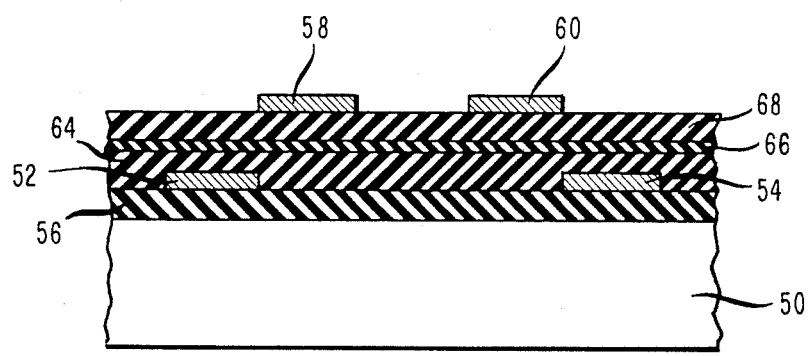
FIG. 10 illustrates a multi-level metal silicon integrated circuit including an intermediate gettering layer formed in accordance with the present invention.

This ionic drift problem in multi-level metal silicon device structures is overcome with the low temperature gettering technique of the present invention. The resultant structure is illustrated in FIG. 10. As seen, the low temperature dielectric 62 is replaced with a tri-level structure comprising a first undoped dielectric layer 64, a relatively thin phosphosilicate glass layer 66 and a second undoped dielectric layer 68. In particular, layer 64 may comprise an undoped glass (plasma-deposited TEOS, for example) deposited to a thickness of approximately 4000 Å. Layer 66 may then be deposited directly over layer 64 to a thickness of, for example, 1000–2000 Å. The remaining dielectric layer 68 is then deposited to a thickness to provide the total desired dielectric thickness, after subsequent processing (etch back and planarization). As discussed above, phosphosilicate glass layer 66 must remain removed from the electrode structure, since the low temperature oxide TEOS used to form layer 66 is undensified and the interaction of the p dopant in glass layer 66 with the metal electrode would result in corrosion of the electrodes.

It is obvious that the formation of the tri-level structure may be performed as single operation, with the phosphorous doping occurring in-situ, that is, being added to the deposition of the dielectric at the correct time in sequence.

Since metal II electrodes must be sintered as a final fabrication step, this sintering process (performed at temperatures of approximately 375° C.) will also anneal p-doped layer 66 to getter the mobile ions from both the underlying and overlying dielectrics. Thus, the resultant multi-level struture, formed with the inventive gettering layer, will be virtually free of ionic drift.

Figure 11:
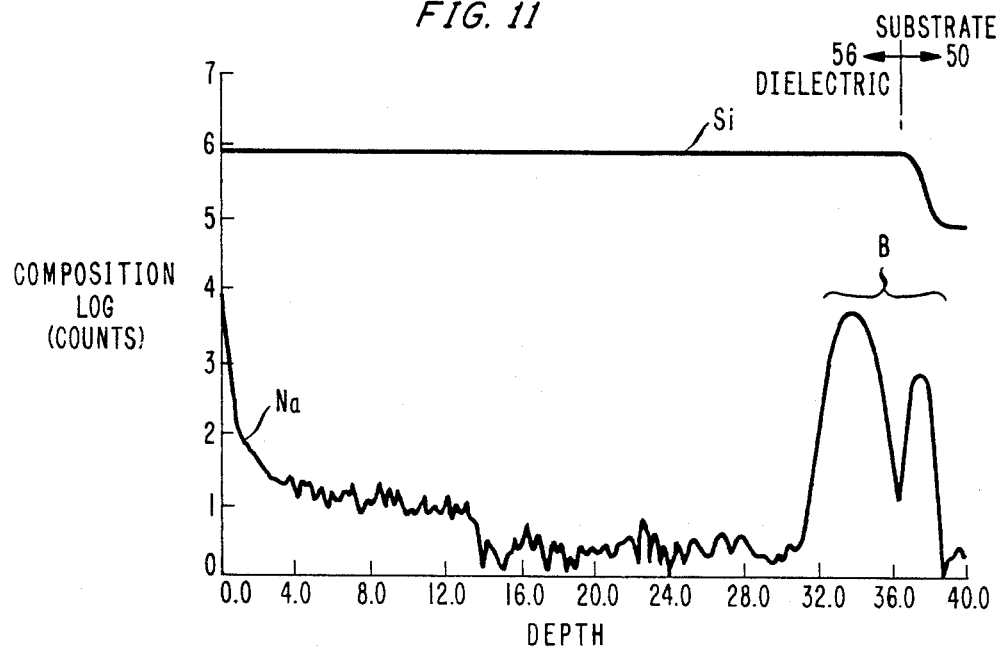
FIG. 11 illustrates a secondary iron mass spectroscopy analysis of a conventional multi-level silicon integrated circuit, illustrating in particular the presence of a significant concentration of sodium ions at the substrate/dielectric interface.
Figure 12:
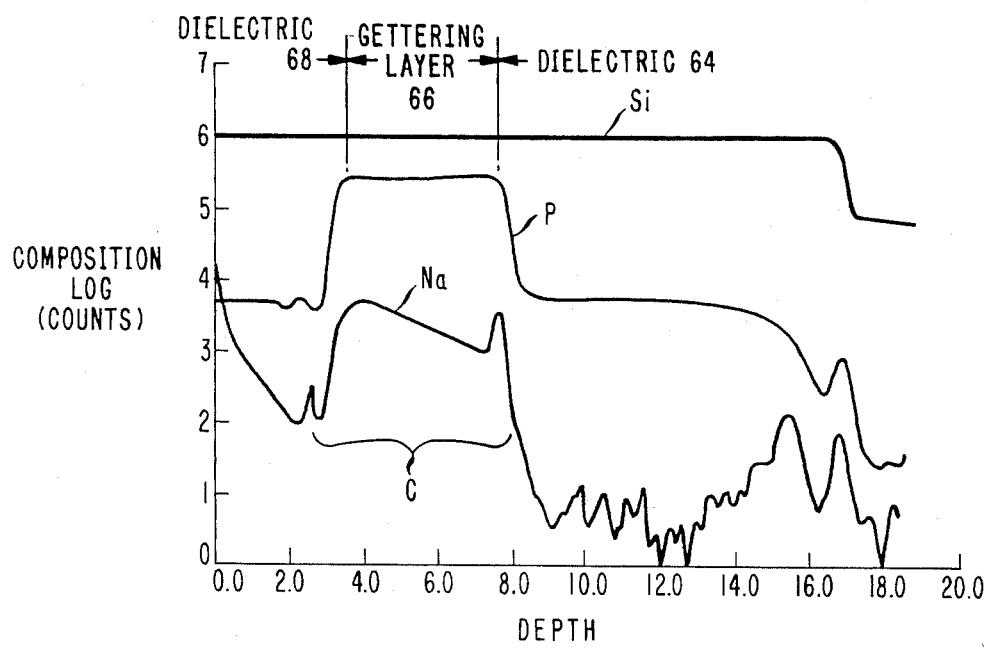
FIG. 12 illustrates a secondary iron mass spectroscopy analysis of a multi-level metal silicon integrated circuit including the intermediate gettering layer formed in accordance with the present invention.

The modification of the composition of a silicon multi-level structure to include the gettering layer of the present invention is clearly illustrated by comparing FIGS. 11 and 12. FIG. 11 is a representation of the composition profile of a conventional prior art multi-level silicon device, such as that illustrated in FIG. 9. FIG. 12 is a representation of the composition profile of a multi-level device including the inventive gettering layer, for example, the structure of FIG. 10. Referring to both FIGS. 11 and 12, the abscissa is defined as the depth of the associated device as measured along a vertical cut, the origin being defined as the top surface of the device. The ordinate is scaled logarithmically to indicate the relative amounts of various materials appearing at any particular depth within the device.

Referring to FIG. 11 in particular, it is obvious that a large concentration of sodium ions, indicated by the letter "B", exists at the bottom of dielectric layer 56 (see FIG. 9), near the interface with the substrate. In contrast, the profile in FIG. 12 of the inventive device shows that virtually all of the sodium ions have been trapped by gettering layer 66, as denoted by region C in the figure. Thus, these ions will remain removed from the active device regions and result in forming a multi-level silicon device which is virtually free of ionic drift.

It is to be noted that the inventive intrinsic low-temperature gettering technique of the present invention is applicable to any device structure, where the two types of devices (photonic and silicon) described above are intended only to illustrate the advantages of ths technique. For example, devices formed utilizing III-V compounds may also utilize the disclosed low-temperature getter. Other and further modifications of the present invention in relation to its use with various other device structures may also become apparent to those skilled in the art and are deemed to fall within the scope of the present invention.

What is claimed is:

1. An integrated optical device formed in a substrate of optically anisotropic material which includes mobile alkali ions, said device comprising waveguiding means formed in said substrate;

dielectric means disposed over said waveguiding means;

electrode means overlaying said waveguiding means; and an annealed gettering material disposed between said dielectric means and said electrode means, said gettering material including alkali ions which migrated from the said substrate during an annealing process.

2. An integrated optical device as defined in claim 1 wherein the gettering material comprises phosphosilicate glass.

3. An integrated optical device as defined in claim 1 wherein the dielectric means comprises a layer of DADBS $SiO_2$.

4. An integrated optical device as defined in claim 1 wherein the dielectric means comprises a layer of dielectric material comprising a thickness in the range of 1500–3000 Å.

5. An integrated optical device as defined in claim 1 wherein the annealed gettering material comprises a thickness in the range of 200–500 Å.

6. An integrated optical device as defined in claim 1 wherein the anneal gettering material comprises a thickness 2%–10% of the thickness of the dielectric means.

* * * * *